(12) United States Patent
Bera et al.

(10) Patent No.: US 7,754,997 B2
(45) Date of Patent: Jul. 13, 2010

(54) APPARATUS AND METHOD TO CONFINE PLASMA AND REDUCE FLOW RESISTANCE IN A PLASMA

(75) Inventors: Kallol Bera, San Jose, CA (US); Yan Ye, Saratoga, CA (US); James D. Carducci, Sunnyvale, CA (US); Daniel J. Hoffman, Saratoga, CA (US); Steven C. Shannon, San Mateo, CA (US); Douglas A. Buchberger, Jr., Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 40 days.

(21) Appl. No.: 11/924,086

(22) Filed: Oct. 25, 2007

(65) Prior Publication Data

US 2008/0105660 A1    May 8, 2008

Related U.S. Application Data

(62) Division of application No. 10/418,996, filed on Apr. 17, 2003.

(51) Int. Cl.
*B23K 9/00* (2006.01)
(52) U.S. Cl. ............................... 219/121.59
(58) Field of Classification Search ............ None
See application file for complete search history.

(56) References Cited

U.S. PATENT DOCUMENTS

| | | | | |
|---|---|---|---|---|
| 4,793,282 A | * | 12/1988 | Greenberg et al. | 118/667 |
| 6,093,281 A | * | 7/2000 | Wise et al. | 156/345.29 |
| 6,129,808 A | * | 10/2000 | Wicker et al. | 156/345.1 |
| 6,143,129 A | | 11/2000 | Savas et al. | |
| 6,551,447 B1 | * | 4/2003 | Savas et al. | 156/345.48 |
| 6,733,620 B1 | * | 5/2004 | Sugiyama et al. | 156/345.29 |
| 7,255,773 B2 | * | 8/2007 | Ogasawara et al. | 156/345.29 |
| 2001/0014540 A1 | * | 8/2001 | Shan et al. | 438/710 |
| 2003/0092278 A1 | * | 5/2003 | Fink | 438/710 |

FOREIGN PATENT DOCUMENTS

EP    1 069 603    1/2001

OTHER PUBLICATIONS mesh. Academic Press Dictionary of Science and Technology (1992). Retrieved Sep. 27, 2006, from xreferplus. http://www.xreferplus.com/entry/3128989.
Office Action dated Oct. 8, 2008 for U.S. Appl. No. 12/201,156.
Office Action dated Apr. 22, 2009 for U.S. Appl. No. 12/201,156.

(Continued)

*Primary Examiner*—Allan Olsen
(74) *Attorney, Agent, or Firm*—Pattersib & Sheridan, LLP

(57) ABSTRACT

An apparatus configured to confine a plasma within a processing region in a plasma processing chamber. In one embodiment, the apparatus includes a ring that has a baffle having a plurality of slots and a plurality of fingers. Each slot is configured to have a width less than the thickness of a plasma sheath contained in the processing region.

5 Claims, 3 Drawing Sheets

OTHER PUBLICATIONS

Office Action dated Mar. 28, 2005 for U.S. Appl. No. 10/418,996.
Final Office Action dated Sep. 20, 2005 for U.S. Appl. No. 10/418,996.
Office Action dated Apr. 5, 2006 for U.S. Appl. No. 10/418,996.
Final Office Action dated Oct. 2, 2006 for U.S. Appl. No. 10/418,996.
Office Action dated Mar. 22, 2007 for U.S. Appl. No. 10/418,996.
Final Office Action dated Jul. 25, 2007 for U.S. Appl. No. 10/418,996.
Office Action dated Apr. 16, 2008 for U.S. Appl. No. 10/418,996.
Preliminary Notice of First Office Action dated May 26, 2009 for Taiwan Patent Application No. 093110640.
Prosecution history of U.S. Appl. No. 10/418,996 as of Sep. 21, 2009.
Prosecution history of U.S. Appl. No. 12/201,156 as of Sep. 21, 2009.

* cited by examiner

APPARATUS AND METHOD TO CONFINE PLASMA AND REDUCE FLOW RESISTANCE IN A PLASMA

CROSS-REFERENCE TO RELATED APPLICATIONS

This application is a divisional of co-pending U.S. patent application Ser. No. 10/418,996, entitled "Apparatus and Method to Confine Plasma and Reduce Flow Resistance in a Plasma Reactor," filed Apr. 17, 2003, which is herein incorporated by reference.

BACKGROUND OF THE INVENTION

1. Field of the Invention

Embodiments of the present invention generally relate to fabrication of semiconductor substrates, and more particularly, to plasma chambers having a confinement ring configured to confine plasma inside the chambers.

2. Description of the Related Art

Generally, a plasma reactor is used to process semiconductor substrates to produce microelectronic circuits. The reactor forms a plasma within a chamber containing the substrate to be processed. One of the processes that is used is a dry etch process, which typically operates within a vacuum vessel to allow the use of RF plasma conditions, to contain the reactive gases necessary for this process, and to prevent atmospheric contamination of the sample during processing. Chambers in such reactors are typically fabricated from aluminum or stainless steel and, as such, represent a potential contamination source. Other possible drawbacks to exposure of the vacuum vessel to plasma conditions include the cost of parts wear-out, defect issues from deposited polymeric species, and variability in the RF current paths. For these reasons, several approaches have been taken by etch system manufacturers to limit the extent of the plasma to a central region within the vacuum vessel and, in this way, segregate the functions of vacuum and plasma containment. This constraint on the extent of the plasma has generally been termed "confinement" of the plasma.

One approach for plasma confinement is to increase the lifetime of electrons to enhance the plasma efficiency by applying magnetic fields in magnetically enhanced reactive ion etch (MERIE) plasma reactors. While this approach allows the confinement of electrons, both ionic species and radical neutrals often interact with chamber walls, thereby causing contamination sputtering and defect issues from polymer build-up.

Therefore, a need exists for an improved apparatus to confine plasma within a processing region inside the plasma chamber.

SUMMARY OF THE INVENTION

Embodiments of the present invention are generally directed to an apparatus configured to confine a plasma within a processing region in a plasma processing chamber. In one embodiment, the apparatus includes a ring that has a baffle having a plurality of slots and a plurality of fingers. Each slot is configured to have a width less than the thickness of a plasma sheath contained in the processing region.

Embodiments of the present invention are also directed to a plasma reactor that includes a chamber, a pedestal disposed within the chamber, a gas distribution plate disposed within the chamber overlying the pedestal, and a ring disposed inside the chamber. The ring includes a baffle having a plurality of slots and a plurality of fingers radially disposed between the pedestal and the chamber. Each slot is configured to have a width less than the thickness of a plasma sheath contained in a processing region inside the chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
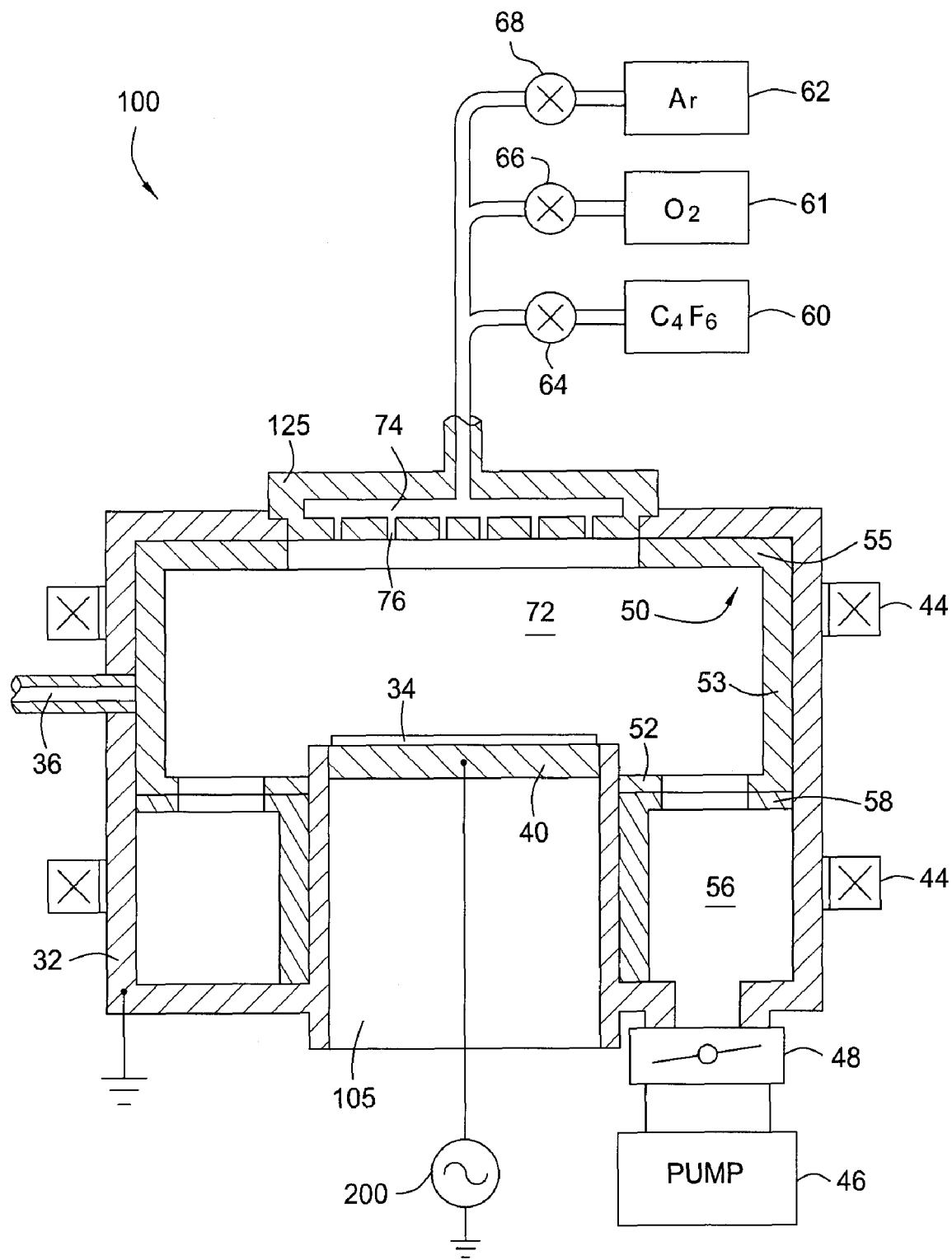
FIG. 1 illustrates an example of a plasma reactor that includes various embodiments of the invention.

FIG. 1 illustrates an example of a plasma reactor 100 that includes various embodiments of the invention. The plasma reactor 100 includes a grounded vacuum chamber 32, which may include liners to protect the walls. A substrate 34 is inserted into the chamber 32 through a slit valve opening 36 and is placed on a cathode pedestal 105 with an electrostatic chuck 40 selectively clamping the substrate. The chuck powering is not illustrated. Unillustrated fluid cooling channels through the pedestal 105 maintain the pedestal at reduced temperatures. A thermal transfer gas, such as helium, is supplied to unillustrated grooves in the upper surface of the pedestal 105. The thermal transfer gas increases the efficiency of thermal coupling between the pedestal 105 and the substrate 34, which is held against the pedestal 105 by the electrostatic chuck 40 or an alternatively used peripheral substrate clamp.

An RF power supply 200, preferably operating at 13.56 MHz, is connected to the cathode pedestal 105 and provides power for generating the plasma while also controlling the DC self-bias. Magnetic coils 44 powered by unillustrated current supplies surround the chamber 32 and generate a slowly rotating (on the order of seconds and typically less than 10 ms), horizontal, essentially DC magnetic field in order to increase the density of the plasma. A vacuum pump system 46 pumps the chamber 32 through an adjustable throttle valve 48 and a plenum 56. A confinement ring 50 is disposed inside the chamber 32 to confine the plasma within a processing region 72, which is defined inside the confinement ring 50. Various embodiments of the confinement ring 50 will be discussed in the following paragraphs.

Processing gases are supplied from gas sources 60, 61, 62 through respective mass flow controllers 64, 66, 68 to a gas distribution plate 125 positioned in the roof of the chamber 32 overlying the substrate 34 and across from a processing region 72. The distribution plate 125 includes a manifold 74 configured to receive the processing gas and communicate with the processing region 72 through a showerhead having a large number of distributed apertures 76, thereby injecting a more uniform flow of processing gas into the processing region 72. An unillustrated VHF power supply, preferably operating at about 162 MHz, may be electrically connected to the gas distribution plate 125 to provide power to the gas distribution plate 125 for generating the plasma.

Other details of the reactor 100 are further described in commonly assigned U.S. Pat. No. 6,451,703, entitled "Magnetically Enhanced Plasma Etch Process Using A Heavy Fluorocarbon Etching Gas", issued to Liu et al. and U.S. Pat. No. 6,403,491, entitled "Etch Method Using A Dielectric Etch Chamber With Expanded Process Window", issued to Liu et al., which are both incorporated by reference herein to the extent not inconsistent with the invention. Although various embodiments of the invention will be described with reference to the above-described reactor, the embodiments of the invention may also be used in other reactors, such as one described in commonly assigned U.S. Ser. No. 10/028,922 filed Dec. 19, 2001, entitled "Plasma Reactor With Overhead RF Electrode Tuned To The Plasma With Arcing Suppression", by Hoffman et al., and issued as U.S. Pat. No. 7,030,335, which is incorporated by reference herein to the extent not inconsistent with the invention.

Figure 2:
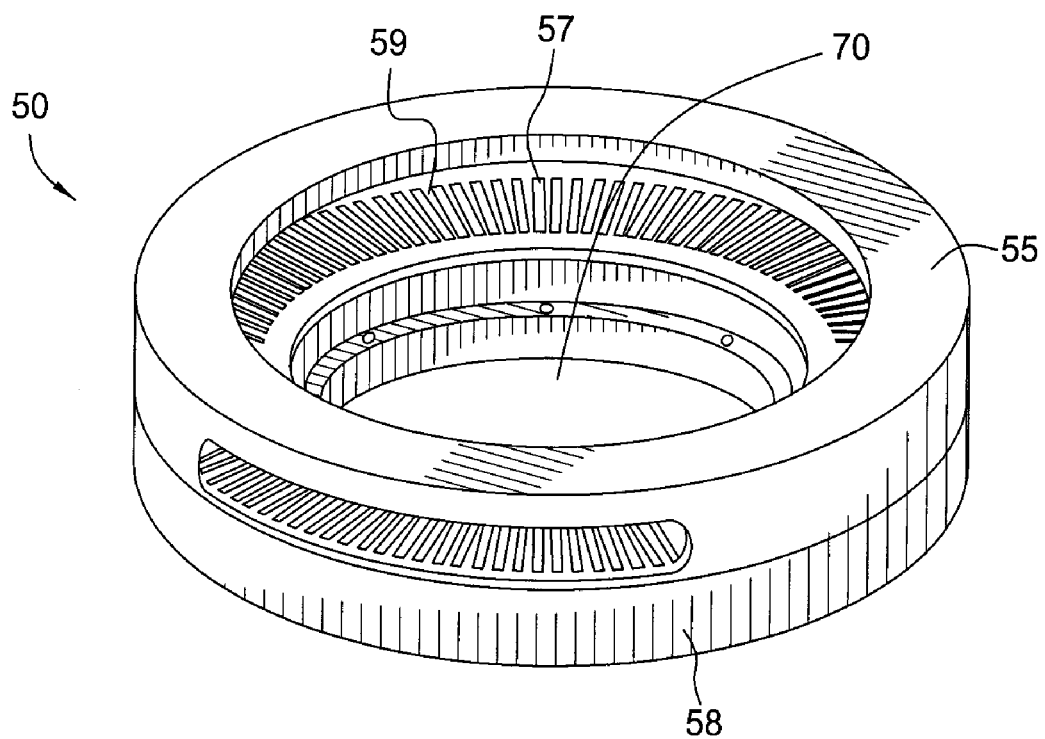
FIG. 2 illustrates a perspective view of the confinement ring in accordance with an embodiment of the invention in greater detail.

FIG. 2 illustrates a perspective view of the confinement ring 50 in accordance with one embodiment of the invention in greater detail. The confinement ring 50 is configured to confine plasma inside the processing region 72 and to reduce flow resistance across the chamber 32. The confinement ring 50 includes a baffle 55 and a base 58 coupled to a bottom portion of the baffle 55. The base 58 is generally configured to provide electrical grounding and mechanical strength for the confinement ring 50. The baffle 55 defines an opening 70 at its top portion. The opening 70 is configured to receive the showerhead of the gas distribution plate 125 so that gases flowing the showerhead will be confined within the processing region 72 inside the baffle 55. The baffle 55 further includes a plurality of slots 57 and a plurality of fingers 59, disposed around the substrate 34. Neutrals in the plasma are configured to pass through the slots 57 into the plenum 56. The slots 57 are designed such that the thickness or width of the plasma sheath is greater than the width of each slot. In this manner, ions and radicals in the plasma are prevented from passing through the confinement ring 50, thereby isolating the plenum 56 from the processing region 72. As a result, polymer build up inside the plenum 56 may be minimized and the amount of power that can be applied to generate the plasma may be increased. In one embodiment, each slot 57 is designed with a width of less than about twice the width or thickness of the plasma sheath. The confinement ring 50 may be made from a material that is electrically conductive to provide a ground path for the RF power supply and the VHF power supply when the plasma is in contact with the confinement ring 50. The confinement ring 50 may also be made from a material that is thermally conductive and etch resistant to minimize localized heating, contamination and process drift. For example, the baffle 55 may be made from silicon carbide (SiC), while the base 58 may be made from aluminum (Al).

Figure 3:
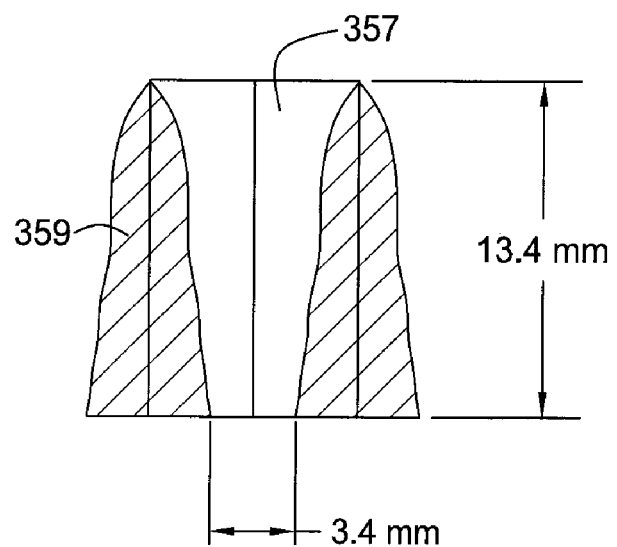
FIG. 3 illustrates a cross sectional view of a confinement ring slot in accordance with an embodiment of the invention.
Figure 4:
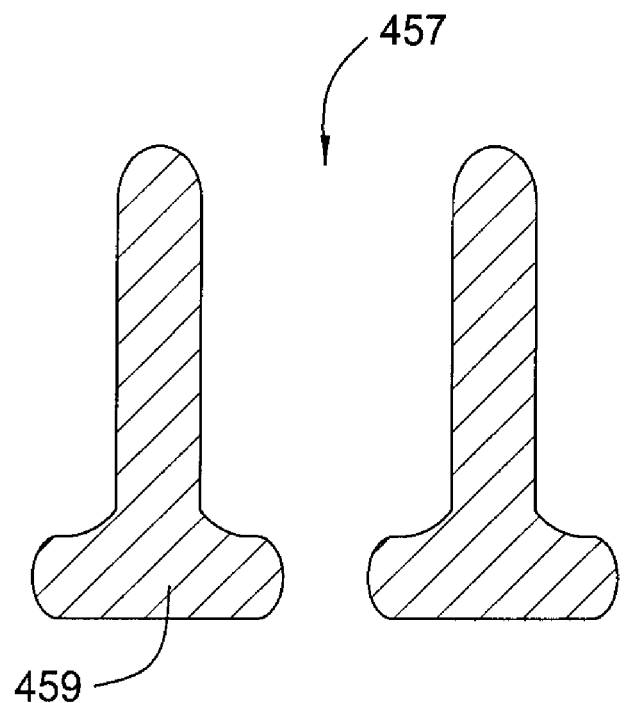
FIG. 4 illustrates a cross sectional view of a confinement ring slot in accordance with another embodiment of the invention.

FIG. 3 illustrates a cross sectional view of a slot 357 in accordance with an embodiment of the invention. As shown in FIG. 3, the finger 359 on each side of the slot 357 has a substantially triangular cross section such that the width at the slot's upper surface is greater than the width at the slot's lower surface. For example, the width of the slot may range from about 3 mm to about 4 mm and the height of the slot may range from about 12 mm to about 15 mm. In one embodiment, the width at the slot's lower surface is about 3.4 mm while the height of the slot is about 13.4 mm. Another embodiment of the invention is illustrated in FIG. 4 in which the finger 459 on each side of the slot 457 has a substantially inverted T cross section. In this manner, the slots in accordance with various embodiments of the invention are configured to reduce the flow resistance (or the pressure drop) through the confinement ring 50 while maintaining plasma confinement. By reducing the flow resistance through the confinement ring 50, the process window for various etch applications for a given pump is improved and the required power to operate the vacuum pumping system 46 is reduced. It has been observed that the confinement ring 50 in accordance with embodiments of the invention is configured to reduce chamber contamination and chamber cleaning time. It has also been observed that the confinement ring 50 is configured to improve pressure uniformity across a substrate, thereby improving the overall process uniformity.

Figure 5:
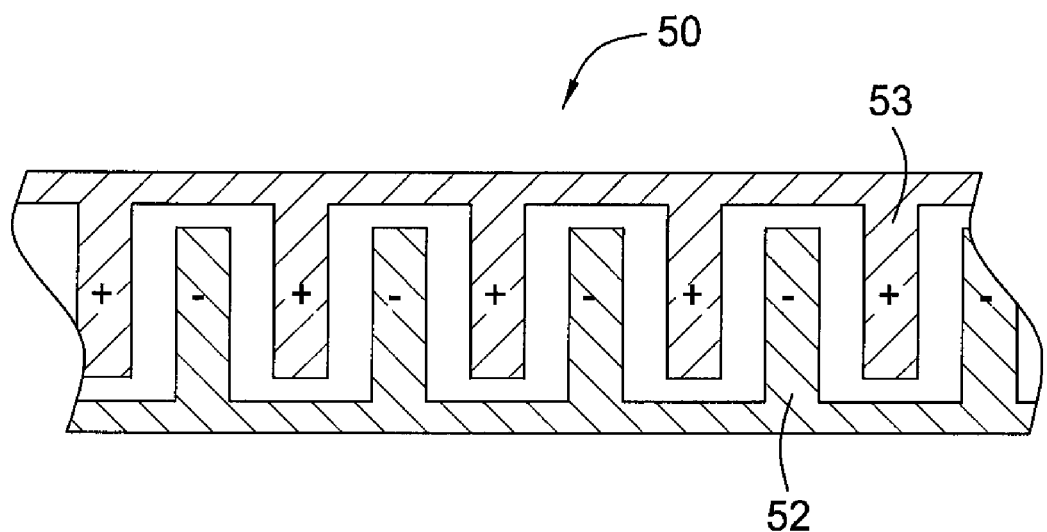
FIG. 5 illustrates biasing alternate confinement ring fingers with a positive bias and the fingers between those alternate fingers with a negative bias in accordance with an embodiment of the invention.

In accordance with another embodiment of the invention, one set of fingers extends from an outside wall 53 of the confinement ring 50 while another set of fingers extends from an inside wall 52 of the confinement ring 50, which is disposed around the substrate support pedestal 105. Each of the fingers extending from the inside wall 52 is positioned between two fingers extending from the outer wall 53. In this manner, every other finger is a finger from the same wall. In one embodiment, the fingers extending from the outer wall 53 are not in electrical contact with the fingers extending from the inner wall 52. In this embodiment, the fingers extending from the outer wall 53 may be biased with a positive bias (e.g., about 50 DC volts) and the fingers extending from the inner wall 52 may be biased with a negative bias (e.g., about −50 DC volts). (See FIG. 5). In this manner, the electric field through the confinement ring 50 is modified so that ions and radicals in the plasma are attracted toward the fingers, thereby causing the ions and the radicals to impinge on the fingers rather than going directly through the slots. As the ions and the radicals impinge on the fingers, the ions and the radicals become neutrals, which will flow through the slots into the plenum 56. In this manner, plasma confinement is further improved. In yet another embodiment, a positive bias (e.g., about 100 volts) is applied to each finger to increase the thickness of the plasma sheath.

While the foregoing is directed to embodiments of the present invention, other and further embodiments of the invention may be devised without departing from the basic scope thereof, and the scope thereof is determined by the claims that follow.

The invention claimed is:

1. A method for confining plasma within a processing region, comprising:
   providing a ring with a baffle having a plurality of slots, wherein each slot has a width less than the width of a plasma sheath contained within the processing region; and
   confining a substantial portion of ions and radicals from the plasma inside the processing region; wherein
   the ring further comprises a finger on each side of the slots, wherein a first finger extends from an inside wall of the ring and a second finger extends from an outer wall of the ring.

2. The method of claim 1, wherein the first finger is biased with a positive bias.

3. The method of claim 2, wherein the second finger is biased with a positive bias.

4. The method of claim 2, wherein a width of each slot is between about 3 mm to about 4 mm.

5. The method of claim 2, wherein a height of each slot is between about 12 mm to about 15 mm.

* * * * *

UNITED STATES PATENT AND TRADEMARK OFFICE
CERTIFICATE OF CORRECTION

PATENT NO. : 7,754,997 B2 Page 1 of 1
APPLICATION NO. : 11/924086
DATED : July 13, 2010
INVENTOR(S) : Bera et al.

It is certified that error appears in the above-identified patent and that said Letters Patent is hereby corrected as shown below:

In the Title (54) and Col. 1, line 3,

Please insert --REACTOR-- after PLASMA.

Signed and Sealed this

Sixteenth Day of November, 2010

David J. Kappos
*Director of the United States Patent and Trademark Office*